(12) United States Patent
Izumi et al.

(10) Patent No.: US 7,112,778 B2
(45) Date of Patent: Sep. 26, 2006

(54) ACTIVE-MATRIX SUBSTRATE AND ELECTROMAGNETIC WAVE DETECTOR

(75) Inventors: Yoshihiro Izumi, Kashihara (JP); Kenji Sato, Otsu (JP)

(73) Assignees: Sharp Kabushiki Kaisha, Osaka (JP); Shimadzu Corporation, Kyoto (JP)

( * ) Notice: Subject to any disclaimer, the term of this patent is extended or adjusted under 35 U.S.C. 154(b) by 145 days.

(21) Appl. No.: 10/763,388

(22) Filed: Jan. 26, 2004

(65) Prior Publication Data

US 2004/0164230 A1 Aug. 26, 2004

(30) Foreign Application Priority Data

Jan. 24, 2003 (JP) .............................. 2003-016754

(51) Int. Cl.
*H01L 31/00* (2006.01)
(52) U.S. Cl. .............................. 250/214.1; 250/208.1; 257/59; 257/222
(58) Field of Classification Search ............ 250/214.1, 250/208.1, 214 R; 348/302, 307, 308; 257/222, 257/225, 233, 59, 72
See application file for complete search history.

(56) References Cited

U.S. PATENT DOCUMENTS 5,563,421 A 10/1996 Lee et al.
6,452,241 B1 * 9/2002 Fukata et al. ............... 257/435
6,750,476 B1 * 6/2004 Katayama ..................... 257/59

FOREIGN PATENT DOCUMENTS

JP 2002250937 A * 9/2002

OTHER PUBLICATIONS

Kasap et al.; "Direct-Conversion Flat-Panel X-Ray Image Sensors for Digital Radiography"; Proceedings of the IEEE, vol. 90, No. 4, Apr. 2002, pp. 591-604.
Zhao et al; "Investigation of Lag and Ghosting in Amorphous Selenium Flat-Panel X-Ray Detectors"; Proceedings of SPIE, vol. 4682, 2002, pp. 9-20.
Korean Office Action and English translation thereof mailed Aug. 26, 2005 in corresponding Korean application No. 10-2004-3989.

* cited by examiner

*Primary Examiner*—Stephone B. Allen
*Assistant Examiner*—Patrick J. Lee
(74) *Attorney, Agent, or Firm*—Nixon & Vanderhye P.C.

(57) ABSTRACT

Pixel electrodes on an active-matrix substrate do not overlap signal lines and scanning lines, and satisfy a relation X1>Y1, where X1 is the gap between the pixel electrodes and the signal lines, and Y1 is the gap between the pixel electrodes and the scanning lines. As a result, a large-area and high-resolution electromagnetic wave detector is realized with an improved S/N ratio, even with an active-matrix array providing a large area for the charge collecting electrodes.

8 Claims, 7 Drawing Sheets

ACTIVE-MATRIX SUBSTRATE AND ELECTROMAGNETIC WAVE DETECTOR

This Nonprovisional application claims priority under 35 U.S.C. § 119(a) on Patent Application No. 2003/016754 filed in Japan on Jan. 24, 2003, the entire contents of which are hereby incorporated by reference.

FIELD OF THE INVENTION

The present invention relates to electromagnetic wave detectors for detecting an image of electromagnetic waves including X-ray radiation, visible light, and infrared light. The invention also relates to a structure of an active-matrix substrate used therefor.

BACKGROUND OF THE INVENTION

In one conventional example of an electromagnetic wave detector, charge collecting electrodes for collecting generated charges in a semiconductor film are two-dimensionally disposed in rows and columns over the semiconductor film, and a switching element is provided for each pixel of the array. The semiconductor film is provided as an electromagnetically conductive film (also known as a photoconductive film) for generating charges (electron-hole pairs) by detecting an electromagnetic wave, for example, such as X-rays. In the electromagnetic wave detector, the charges are read from one column to another by successively scanning (turning ON) the switching elements row by row.

The structure and principle of such a two-dimensional electromagnetic wave detector are disclosed in, for example, S. O. Kasap, J. A. Rowlands, "Direct-Conversion Flat-Panel X-Ray Image Sensors for Digital Radiography," Proceedings of the IEEE, April, 2002, Vol. 90, No. 4, pp. 591–604. The following briefly describes the structure and principle of the electromagnetic wave detector of this conventional example.

FIG. 8 is a cross sectional view illustrating the principle by which the electromagnetic wave detector detects charge. The electromagnetic wave detector includes a semiconductor film 101 having an electromagnetically conductive property, as represented by a-Se for example. The upper layer of the semiconductor film 101 is a bias electrode 102, and charge collecting electrodes 103 are disposed under the semiconductor film 101. The charge collecting electrodes 103 are connected to capacitors (Cs) 104, which are connected to a charge detecting amplifier 106 via switching elements 105 such as FET (TFT).

An incident electromagnetic wave such as X-rays on the electromagnetic wave detector generates charges (electron-hole pairs) in the semiconductor film 101. In response to an applied bias voltage across the bias electrode 102 and the charge collecting electrodes 103, the electrons and holes in the semiconductor film 101 move toward the anode and cathode, respectively, thereby storing charges in the capacitors 104. By turning ON the switching elements 105, the stored charges in the capacitors 104 are drawn to the charge detecting amplifier 106. The intensity of the incident electromagnetic wave on the semiconductor film 101 is determined from the amount of charge detected by the charge detecting amplifier 106.

The constituting elements of the electromagnetic wave detector, including the charge collecting electrodes, the capacitors, and the switching elements, may be disposed in a two-dimensional matrix, and the charge may be read line by line to obtain two-dimensional information of the electromagnetic wave being imaged. The two-dimensional matrix array may be an active-matrix array using thin film transistors (TFT) as the switching elements.

FIG. 9(a) is a cross sectional view illustrating a pixel-wise structure of an electromagnetic wave detector including an active-matrix array 110, a semiconductor film 101, and a bias electrode 102, which are formed in this order from the bottom. The active-matrix array 110 includes switching elements 105, capacitors 104, charge collecting electrodes 103, and wires for addressing these elements, the wires including scanning lines (gate lines) 107 and signal lines (source lines) 108, as shown in FIG. 9(b) for example. FIG. 9(b) is a plan view of the active-matrix array 110 of FIG. 9(a), showing a layout for one of the pixels.

With this structure, a large-area and high-resolution electromagnetic wave detector can be realized. In medical applications such as chest radiography, the electromagnetic wave detector needs to have an area measuring about 17×17 inches, and requires about 3000×3000 pixels. This requires the scanning lines 107 and the signal lines 108 forming a lattice on the active-matrix array to accurately carry electrical signals at high frequency, calling for array design that minimizes the respective time constants (wire resistance× wire capacitance) of the scanning and signal lines 107 and 108.

For a large-area and high-resolution electromagnetic wave detector, such array design can be suitably achieved by a structure in which the charge collecting electrodes 103 do not overlap the scanning lines 107 and the signal lines 108, as shown in FIG. 9(b). This structure eliminates the parasitic capacitance generated in regions where the charge collecting electrodes 103 overlap the scanning lines 107 and the signal lines 108, thereby reducing the respective wire capacitances of the scanning lines 107 and the signal lines 108.

However, the structure in which the charge collecting electrodes 103 does not overlap the scanning lines 107 and the signal lines 108 poses a problem in that the charge collecting electrodes 103 generate electric field lines that radiate from the edges of the charge collecting electrodes 103 toward the scanning lines 107 and the signal lines 108. That is, the parasitic capacitance is generated, though small, between the charge collecting electrodes 103 and the scanning lines 107 and the signal lines 108.

The parasitic capacitance between the charge collecting electrodes 103 and the scanning and signal lines 107 and 108 (signal lines 108 in particular) may be reduced with a pixel layout that can maximize a gap between the charge collecting electrodes 103 and the scanning and signal lines 107 and 108. A drawback of such a pixel layout, however, is that the increased gap between the charge collecting electrodes 103 and the scanning and signal lines 107 and 108 brings about a proportional decrease in the area occupied by the charge collecting electrodes 103 (also known as and hereinafter referred to as "fill factor"). With the reduced fill factor of the charge collecting electrodes 103, the efficiency of collecting charge becomes poor, and the sensitivity of the electromagnetic wave detector drops.

SUMMARY OF THE INVENTION

An object of the present invention is to provide a large-area and high-resolution electromagnetic wave detector having an improved S/N ratio, using an active-matrix array that can maximize the fill factor of the charge collecting electrodes.

In order to achieve this object, an active-matrix substrate of the present invention includes: a substrate; a signal line;

a scanning line; a switching element; and a pixel electrode, the signal line and the scanning line forming a lattice on the substrate, and the switching element and the pixel electrode being provided for each unit lattice of the signal line and the scanning line, the pixel electrode not overlapping the signal line and the scanning line, and satisfying a relation X1>Y1, where X1 is a gap between the pixel electrode and the signal line, and Y1 is a gap between the pixel electrode and the scanning line.

Further, in order to achieve the foregoing object, an electromagnetic wave detector of the present invention includes: an active-matrix substrate; a semiconductor film, disposed on the active-matrix substrate, for generating charge in response to an electromagnetic wave being detected; and a pixel electrode, disposed on the active-matrix substrate, serving as an electrode for collecting generated charge in the semiconductor film, the active-matrix substrate including: a substrate; a signal line; a scanning line; a switching element; and a pixel electrode, the signal line and the scanning line forming a lattice on the substrate, and the switching element and the pixel electrode being provided for each unit lattice of the signal line and the scanning line, and the pixel electrode not overlapping the signal line and the scanning line, and satisfying a relation X1>Y1, where X1 is a gap between the pixel electrode and the signal line, and Y1 is a gap between the pixel electrode and the scanning line.

In order to improve the S/N ratio of the read-out signals, the electromagnetic wave detector using the active-matrix substrate requires the signal lines to have a smaller wire capacitance than the scanning lines. By satisfying X1>Y1, the parasitic capacitance generated between the pixel electrodes (charge collecting electrodes) and the signal and scanning lines in the active-matrix substrate can be reduced more for the signal lines than for the scanning lines.

With the structure in which the gap X1 between the pixel electrodes and the signal lines is wider than the gap Y1 between the pixel electrodes and the scanning lines, an electromagnetic wave detector is realized that provides a superior S/N ratio by reducing the wire capacitance of the signal lines, while maximizing the fill factor of the pixel electrodes (charge collecting electrodes).

For a fuller understanding of the nature and advantages of the invention, reference should be made to the ensuing detailed description taken in conjunction with the accompanying drawings.

BRIEF DESCRIPTION OF THE DRAWINGS

FIG. 1($b$) is a plan view of the electromagnetic wave detector shown in FIG. 1($a$).

FIG. 2($b$) is a plan view showing profiles of a signal line and a source electrode; and FIG. 2($c$) is a plan view showing profiles of a capacitor line and a capacitor electrode.

FIG. 9($b$) is a plan view of the conventional electromagnetic wave detector shown in FIG. 9($a$).

DESCRIPTION OF THE EMBODIMENTS

[First Embodiment]
One embodiment of the present invention is described below with reference to the attached drawings. As used herein, the term "electromagnetic wave detector" refers to an electromagnetic wave detector with a two-dimensional array of electromagnetic wave detecting elements respectively corresponding to the pixels of a detected image.

Figure 1:
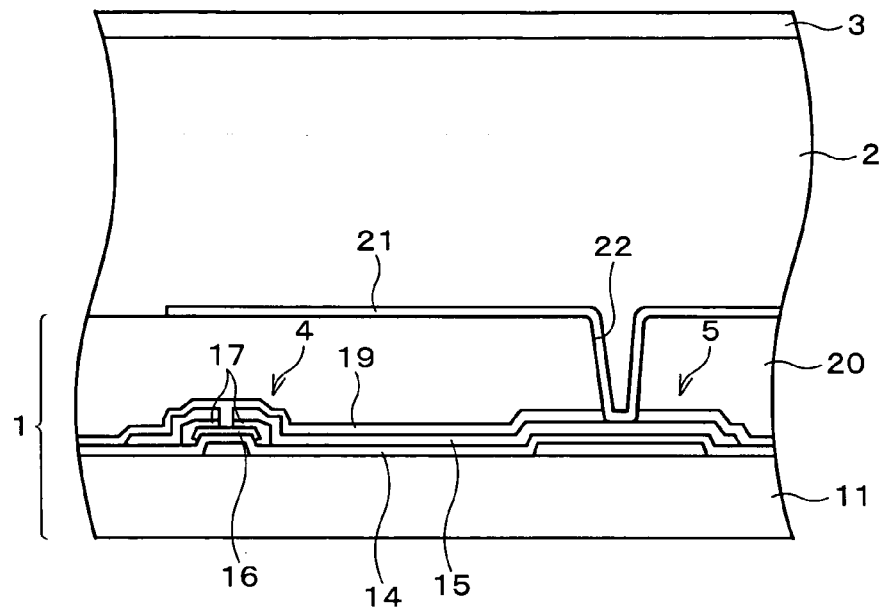
FIG. 1($a$) is a cross sectional view illustrating a pixel-wise structure of an electromagnetic wave detector in one embodiment of the present invention.
Figure 1:
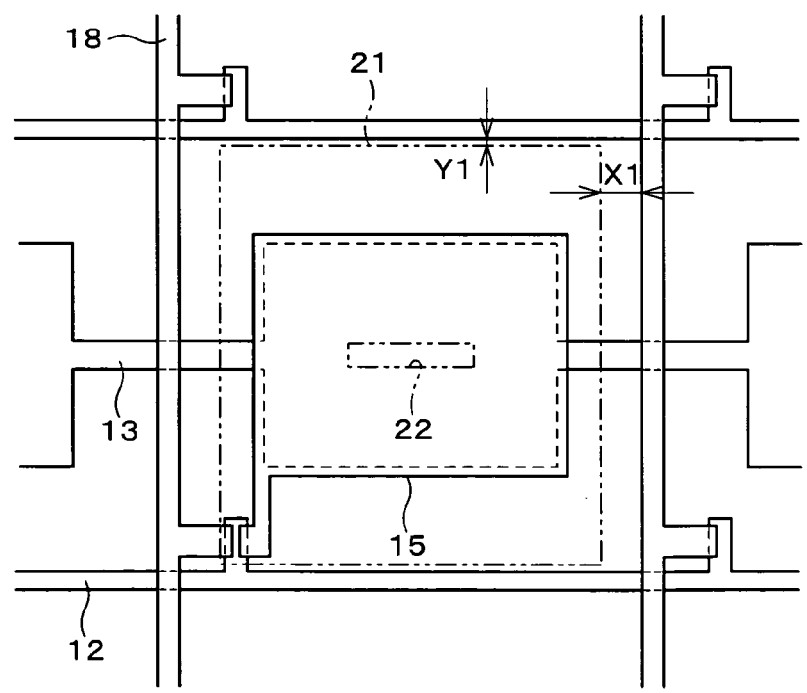

FIG. 1($a$) is a plan view illustrating a pixel-wise structure of the electromagnetic wave detector, and FIG. 1($b$) is a cross sectional view of the structure shown in FIG. 1($a$). The pixel illustrated in FIG. 1($a$) and FIG. 1($b$) measures about 0.1 mm×0.1 mm to about 0.3 mm×0.3 mm, and the electromagnetic wave detector generally includes about 500× 500 to about 3000×3000 pixels of this size that are disposed in an X-Y matrix. For the radiography of the chest, the electromagnetic wave detector should measure about 17×17 inches.

As illustrated in FIG. 1 ($a$) and FIG. 1 ($b$), the electromagnetic wave detector includes an active-matrix substrate 1, a semiconductor film 2 with electromagnetic conductivity, and a bias electrode (common electrode) 3 connected to a power supply (not shown), the semiconductor film 2 and the bias electrode 3 being formed in this order on the active-matrix substrate 1. By the irradiation of electromagnetic wave such as X rays, charge (electron-hole) is generated inside the semiconductor film 2. The semiconductor film 2 is therefore electromagnetically conductive, and converts electromagnetic image information of radiation such as X rays into electrical information.

The semiconductor film 2 is made of amorphous a-Se (amorphous selenium) for example, the selenium being the main component (content of not less than 50%). Other examples of materials for the semiconductor film 2 include CdTe, CdZnTe, PbI$_2$, HgI$_2$, GaAs, and Si. A charge blocking layer or a buffer layer may optionally be provided above and/or below the semiconductor film 2. In the electromagnetic wave detector of the present embodiment, the semiconductor film 2 is defined to include these additional members. The charge blocking layer and buffer layer may be realized by, for example, an Se layer containing As or Te, an Se layer doped with a trace amount of halogen, alkali metal, and the like, or a high-resistance semiconductor layer containing Sb$_2$S$_3$, CeO$_2$, or CdS, and the like.

The active-matrix substrate 1 is described below in detail. The active-matrix substrate 1 includes a glass substrate 11, scanning lines (gate electrodes) 12, capacitor lines (capacitor electrodes) 13, a gate insulating film 14, junction electrodes 15, a channel layer 16, a contact layer 17, signal lines (source electrodes) 18, an insulating protective film 19, an interlayer insulating film 20, and pixel electrodes (charge collecting electrodes) 21. In the active-matrix substrate 1, the signal lines 18 and the scanning lines 12 are disposed in the form of a lattice on the glass substrate 11. In each unit lattice, a TFT (Thin Film Transistor; switching element) 4 and the pixel electrode 21 are formed.

In the active-matrix substrate 1, the TFT 4 is realized by the scanning lines 12, the gate insulating film 14, the signal lines 18, the junction electrodes 15, the channel layer 16, and the contract layer 17, etc. The active-matrix substrate 1 also includes capacitors (Cs) 5 that are realized by the capacitor lines 13, the gate insulating film 14, and the junction electrodes 15, etc.

Figure 2:
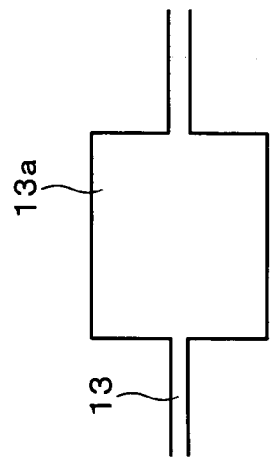
FIG. 2($a$) is a plan view showing profiles of a scanning line and a gate electrode.
Figure 2:
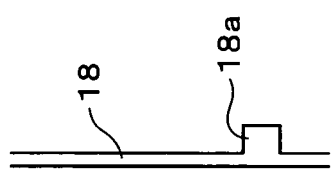
Figure 2:
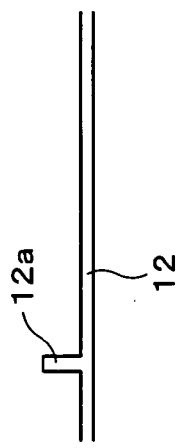

In the present embodiment, as shown in FIG. 2(*a*) through FIG. 2(*c*), part of the scanning lines 12 making up the TFT 4 is called gate electrode 12*a*, and part of the signal lines 18 making up the TFT 4 is called source electrode 18*a*. Similarly, part of the capacitor lines 13 making up the capacitor 5 is called capacitor electrode 13*a*.

Further, in the present embodiment, the gate electrode 12*a*, the source electrode 18*a*, and the capacitor electrode 13*a* are part of the scanning lines 12, the signal lines 18, and the capacitor lines 13, respectively. Alternatively, the gate electrode 12*a*, the source electrode 18*a*, and the capacitor electrode 13*a* may be separately provided from the scanning lines 12, the signal lines 18, and the capacitor lines 13, respectively.

The glass substrate 11 is a supporting member, for which a non-alkali glass substrate (the product #1737 of Corning Inc., for example) may be used, for example. The scanning lines 12 and the signal lines 18 are conductive wires (metal wires) that are disposed in the form of a lattice. The TFT 4 is formed at each intersection of the scanning lines 12 and the signal lines 18.

The TFT 4, which is a switching element, has a source and drain respectively connected to the signal lines 18 and the junction electrodes 15. That is, the signal lines 18 include a trunk, serving as a signal line, and a branch (source electrode 18*a*), realizing the TFT 4. The junction electrode 15 constitutes the drain electrode of the TFT 4, and connects the TFT 4 to the capacitor 5.

For the gate insulating film 14, $SiN_X$ or $SiO_X$, and the like may be used. The gate insulating film 14 is provided to cover the gate electrodes 12*a* and the capacitor electrodes 13*a*. Portions of the gate insulating film 14 covering the gate electrodes 12*a* serve as a gate insulating film for the TFT 4, and portions of the gate insulating film 14 covering the capacitor electrodes 13*a* serve as a dielectric layer for the capacitor 5. That is, the capacitor 5 is defined by an area where the junction electrode 15 overlaps the capacitor electrode 13*a* that is formed on the same level as the gate electrode 12*a*. Note that, the gate insulating film 14 is not just limited to $SiN_X$ and $SiO_X$, but may be prepared by anodizing gate electrodes 14*a* and the capacitor electrodes 13*a*.

The channel layer (i layer) 16 is a channel section of the TFT 4, and it provides a current path between the source electrode 18*a* and the junction electrode 15. The contact layer (n+layer) 17 provides a contact between the channel layer 16 and the source electrode 18*a*, and between the channel layer 16 and the junction electrode 15.

The insulating protective film 19 is formed on the signal lines 18 and the junction electrodes 15, i.e., over substantially the entire surface or area of the glass substrate 11. The insulating protective film 19 is so formed to protect and electrically insulate the junction electrodes 15 and the source electrodes 18*a*. Through predetermined portions of the insulating protective film 19, contact holes 22 are formed. More specifically, the contact holes 22 are formed through portions of the insulating protective film 19 where the junction electrodes 15 face the capacitor electrodes 13*a* via the capacitors 5.

Above the insulating protective film 19 is the interlayer insulating film 20. The interlayer insulating film 20 is made of resin, and is provided to planarize the TFT 4. On the interlayer insulating film 20 are formed pixel electrodes 21 in the form of an ITO or Al conductive film. Namely, the pixel electrodes 21 constitute the uppermost layer of the active-matrix substrate 1. The contact holes 22 of the insulating protective film 19 extend through the interlayer insulating film 20, and the pixel electrodes 21 are connected to the junction electrodes 15 via the contact holes 22.

Substantially the entire surface of the pixel electrodes 21 are covered with the semiconductor film 2 and the bias electrode 3.

Between the bias electrode 3 and the capacitor electrodes 13*a* is connected a power supply (not shown) for applying a voltage to the semiconductor film 2. An applied voltage from the power supply generates an electric field between the bias electrode 3 and the pixel electrodes 21 via the capacitors 5. The semiconductor film 2 and the capacitors 5 are electrically connected to each other in series. With this structure, when the semiconductor film 2 absorbs X rays or other electromagnetic radiation and generates charge (electron-hole pair) under applied bias voltage to the bias electrode 3, the generated charge is caused to migrate, with the electrons moving toward the anode and the holes moving toward the cathode. The charge accumulates in the capacitors 5.

Figure 8:
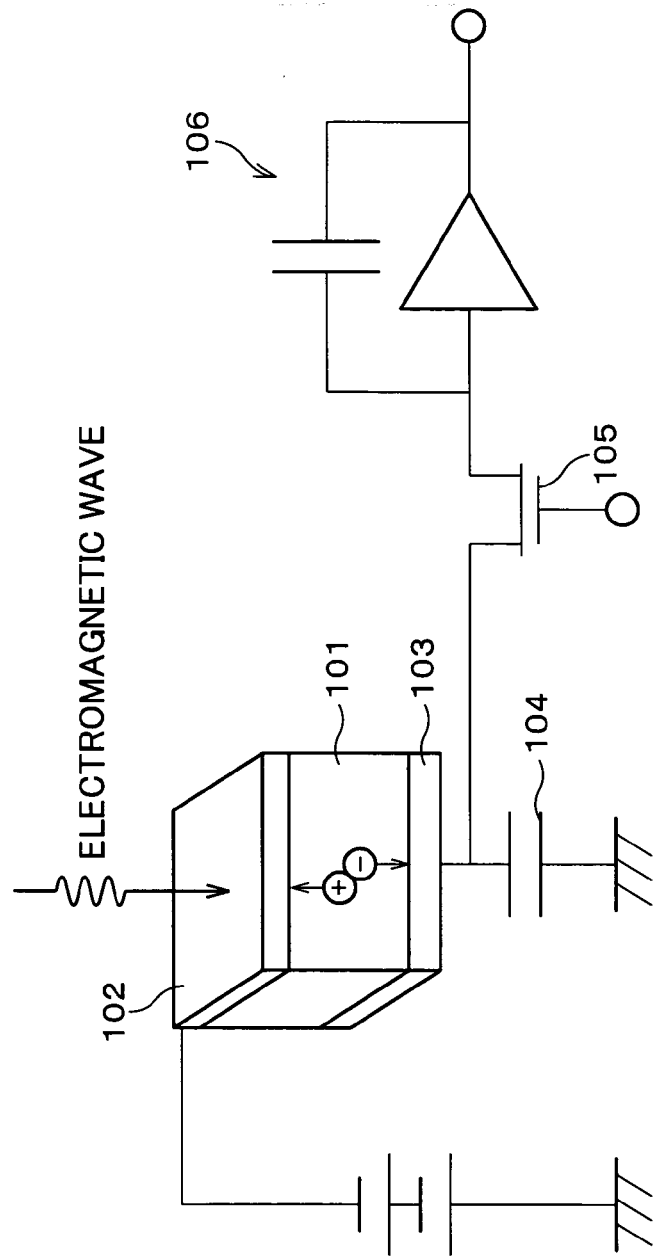
FIG. 8 is a cross sectional view explaining the principle by which the electromagnetic wave detector detects charge.
Figure 9:
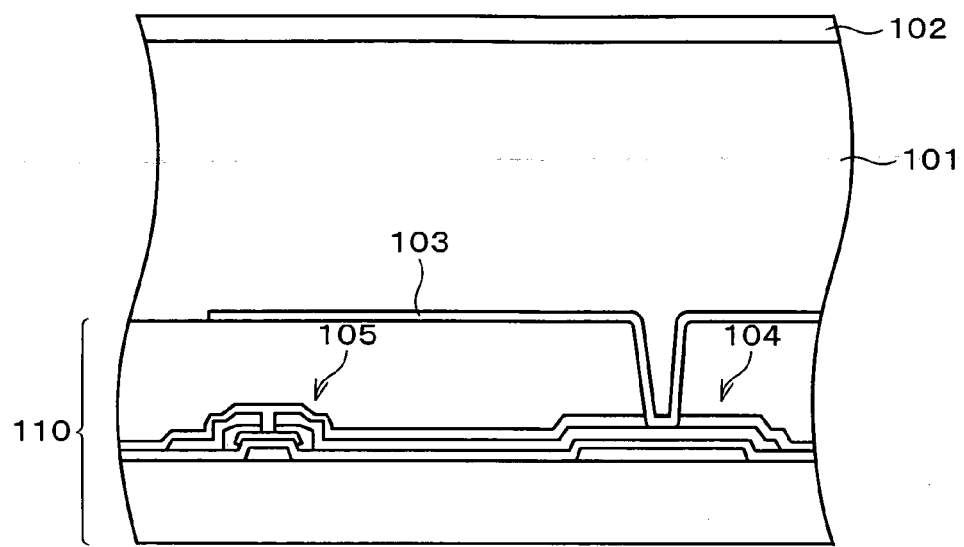
FIG. 9($a$) is a cross sectional view illustrating a pixel-wise structure of a conventional electromagnetic wave detector.
Figure 9:
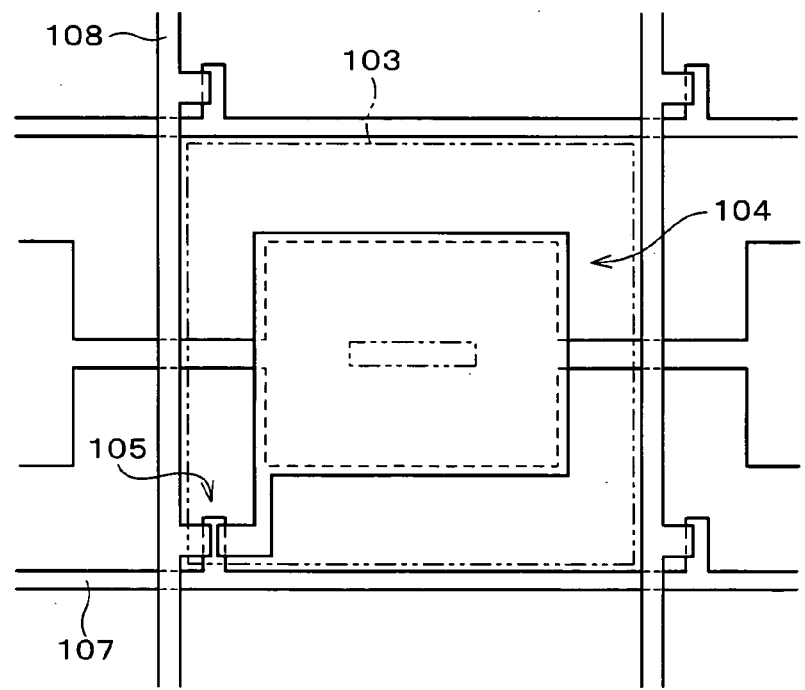

The pixel electrodes 21 are disposed either one-dimensionally or two-dimensionally throughout the electromagnetic wave detector. Further, in the electromagnetic wave detector, the capacitors 5 are respectively connected to the pixel electrodes 21, and the TFTs 4 are respectively connected to the capacitors 5. With this structure, one-dimensional or two-dimensional electromagnetic information is temporarily stored in the capacitors 5, and the TFTs 4 are successively scanned, thereby easily reading the electrical information of one-dimensional or two-dimensional form. To read the electrical information, the signal lines 18 are connected to a charge detecting amplifier (see FIG. 8).

According to one basic structure of the electromagnetic wave amplifier in one embodiment of the present invention as described above, the following will describe features of the electromagnetic wave detector.

In order to realize a large-area and high-resolution electromagnetic wave detector, electrical signals need to be accurately transmitted through the scanning lines 12 and the signal lines 18 at high frequency. This can be achieved by an array structure that is designed to minimize the respective time constants (wire resistance×wire capacitance) of the scanning lines 12 and the signal lines 18, as described in the BACKGROUND OF THE INVENTION section.

As a rule, the large-area and high-resolution electromagnetic wave detector requires designing in which the pixel electrodes 21 do not overlap the scanning lines 12 and the signal lines 18, so that the parasitic capacitance can be reduced between the pixel electrodes 21 and the scanning lines 12, and between the pixel electrodes 21 and the signal lines 18. However, the structure in which the pixel electrodes 21 do not overlap the scanning lines 12 and the signal lines 18 poses a problem when the gap between the pixel electrodes 21 and the scanning and signal lines 12 and 18 is small. Namely, in this case, the pixel electrodes 21 generate electric field lines that radiate from the edges of the pixel electrodes 21 toward the scanning lines 12 and the signal lines 18, with the result that the parasitic capacitance cannot be eliminated completely.

For optimum pixel layout, the electromagnetic wave detector of the present embodiment is designed taking into account the following two factors.

The first factor is that increasing the gap between the pixel electrodes 21 and the scanning and signal lines 12 and 18 reduces the parasitic capacitance in between, but doing so reduces the fill factor of the electromagnetic wave detector.

It is well known that the fill factor of the pixel electrodes 21 should be maximized to efficiently guide the generated charge in the semiconductor film 2 to the capacitors 5. The inventors of the present invention have found that the collection efficiency of charge decreases abruptly when the fill factor of the pixel electrodes 21 falls below 50%. It is therefore preferable that the fill factor of the pixel electrodes 21 be no smaller than 50%, or more preferably no smaller than 65%.

The second factor is that the wire capacitance of the signal lines 18 directly influences the S/N ratio of read-out signals when the ends of the signal lines 18 are connected to the charge detecting amplifier, since the gain of noise in the read-out signals from the signal lines 18 is represented by 1+Cd/Cf, where Cd is the wire capacitance of the signal lines, and Cf is the feedback capacitance of the charge detecting amplifier. Thus, in order to improve the S/N ratio of the read-out signals, the signal lines 18 requires a smaller wire capacitance than the scanning lines 12.

By taking into account these two factors, the pixel electrodes 21 of the electromagnetic wave detector of the present embodiment are substantially rectangular in shape, and do not overlap the scanning lines 12 or the signal lines 18. This is to minimize the respective time constants (wire resistance×wire capacitance) of the scanning lines 12 and the signal lines 18 and thereby enables electric signals to be accurately transmitted through the scanning lines 12 and the signal lines 18 at high frequency. In this way, a large-area and high-resolution electromagnetic wave detector can be realized.

With the structure in which the pixel electrodes 21 do not overlap the scanning lines 12 and the signal lines 18, no capacitance will be generated between the scanning lines 12 and the pixel electrodes 21, and between the signal lines 18 and the pixel electrodes 21.

However, the structure in which the pixel electrodes 21 do not overlap the scanning lines 12 and the signal lines 18 poses a problem when the gap between the pixel electrodes 21 and the scanning and signal lines 12 and 18 is small. Namely, in this case, the pixel electrodes 21 generate electric field lines that radiate from the edges of the pixel electrodes 21 toward the scanning line 12 and the signal lines 18, with the result that the parasitic capacitance cannot be eliminated completely. The parasitic capacitance can be reduced by widening the gap between the pixel electrodes 21 and the scanning and signal lines 12 and 18 as much as possible.

However, widening the gap between the pixel electrodes 21 and the scanning and signal lines 12 and 18 reduces the fill factor of the pixel electrodes 21. In order to prevent this, the present embodiment is designed to introduce a relationship X1>Y1, where X1 is the gap between the pixel electrodes 21 and the signal lines 18, and Y1 is the gap between the pixel electrodes 21 and the scanning lines 12, as shown in FIG. 1(b). In other words, compared with the substantially square lattice of the scanning lines 12 and the signal lines 18 defining the pixels, the pixel electrodes 21 of the present embodiment are rectangular in shape with the longer sides along the signal lines 18.

The second factor requires that the signal lines 18 have a smaller wire capacitance than the scanning lines 12. With the relation X1>Y1 defining the gap between the pixel electrodes 21 and the scanning and signal lines 12 and 18, the present invention effectively reduces the wire capacitance of the signal lines 18 while maximizing the fill factor of the pixel electrodes 21. As a result, a large-area and high-resolution electromagnetic wave detector can be realized.

An electromagnetic wave detector according to the present invention may be designed with X1=5 μm to 25 μm and Y1=0 μm to 5 μm, when the pixel pitch is 100 μm to 200 μm for example. Such a layout enables the wire capacitance of the signal lines 18 to be reduced while maximizing the fill factor of the pixel electrodes 21.

Figure 6:
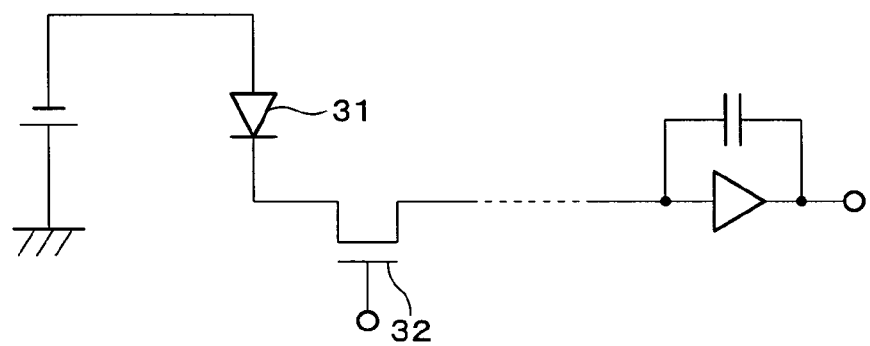
FIG. 6 is a cross sectional view explaining the principle by which the electromagnetic wave detector detects charge in a structure where photodiode elements are respectively provided for the pixels of the active-matrix substrate.
Figure 7:
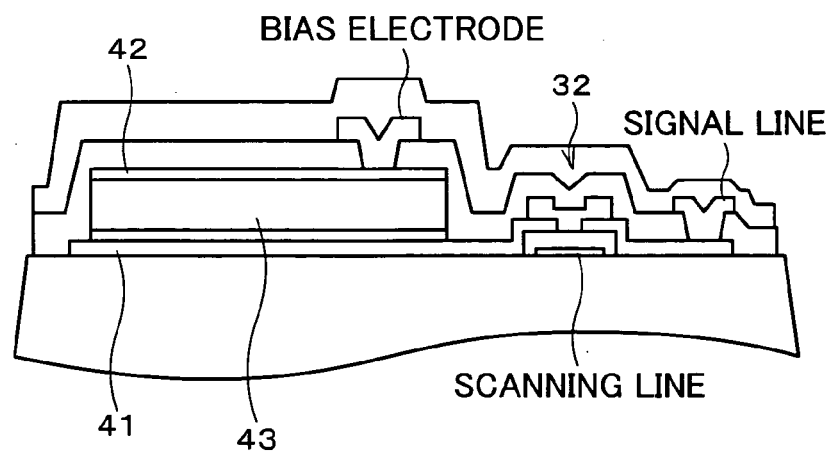
FIG. 7 is a cross sectional view illustrating a pixel-wise structure of the electromagnetic wave detector in which photodiode elements are respectively provided for the pixels of the active-matrix substrate.

The present invention, which was described in the present embodiment based on a structure of the active-matrix substrate applicable to electromagnetic wave detectors of a direct conversion type, is not limited thereto and is also applicable to electromagnetic wave detectors (photo-electric converters) that include a photodiode for each pixel of the active-matrix substrate. FIG. 6 is a circuit diagram of such an electromagnetic wave detector, and FIG. 7 is a cross sectional view illustrating a pixel-wise element structure therefor. The structure includes a photodiode 31 of a construction in which a semiconductor 43 is disposed between first electrodes 41 and second electrodes 42, where the first electrodes 41 are respectively provided for the pixels connected to the TFT elements 32, and the second electrodes 42 are commonly provided for the pixels. The first electrodes 41 correspond to the pixel electrodes of the present invention.

[Second Embodiment]

Referring to the attached drawings, the following will describe a modification example of the electromagnetic wave detector of the First Embodiment.

Figure 3:
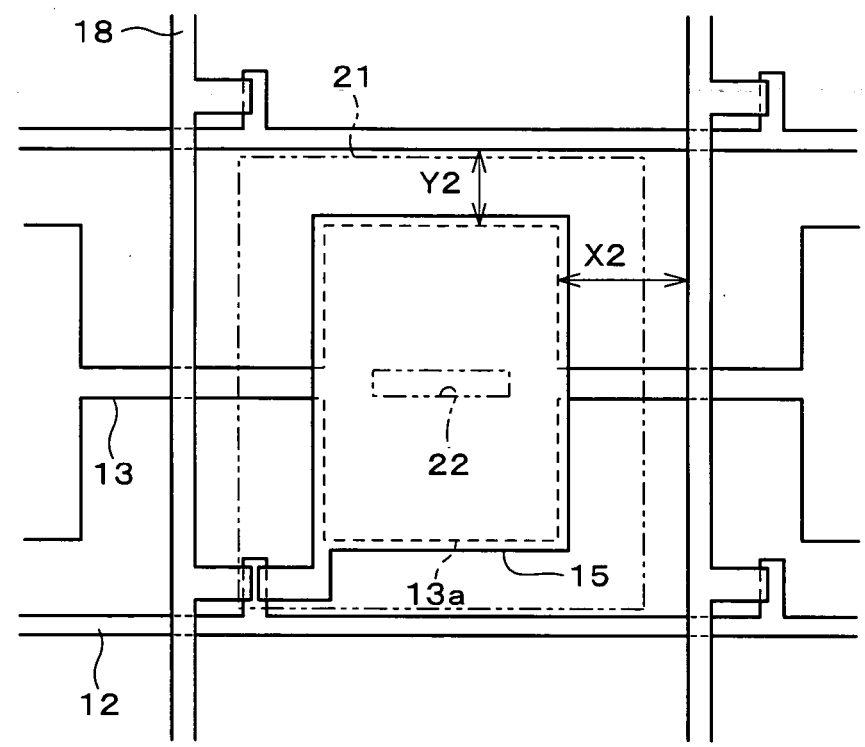
FIG. 3 is a plan view illustrating a pixel-wise structure of an electromagnetic wave detector in another embodiment of the present invention.

FIG. 3 is a plan view illustrating a pixel-wise structure of an electromagnetic wave detector of the present embodiment. As to the cross sectional structure, the electromagnetic wave detector of the present embodiment is basically the same as that described in the First Embodiment.

The present embodiment has a pixel layout that differs from the First Embodiment with respect to the profile of the capacitor electrodes 13a defining the capacitors 5. Specifically, as illustrated in FIG. 3, a relation X2>Y2 is satisfied, where X2 is the gap between the capacitor electrodes 13a and the signal lines 18, and Y2 is the gap between the capacitor electrodes 13a and the scanning lines 12.

Figure 4:
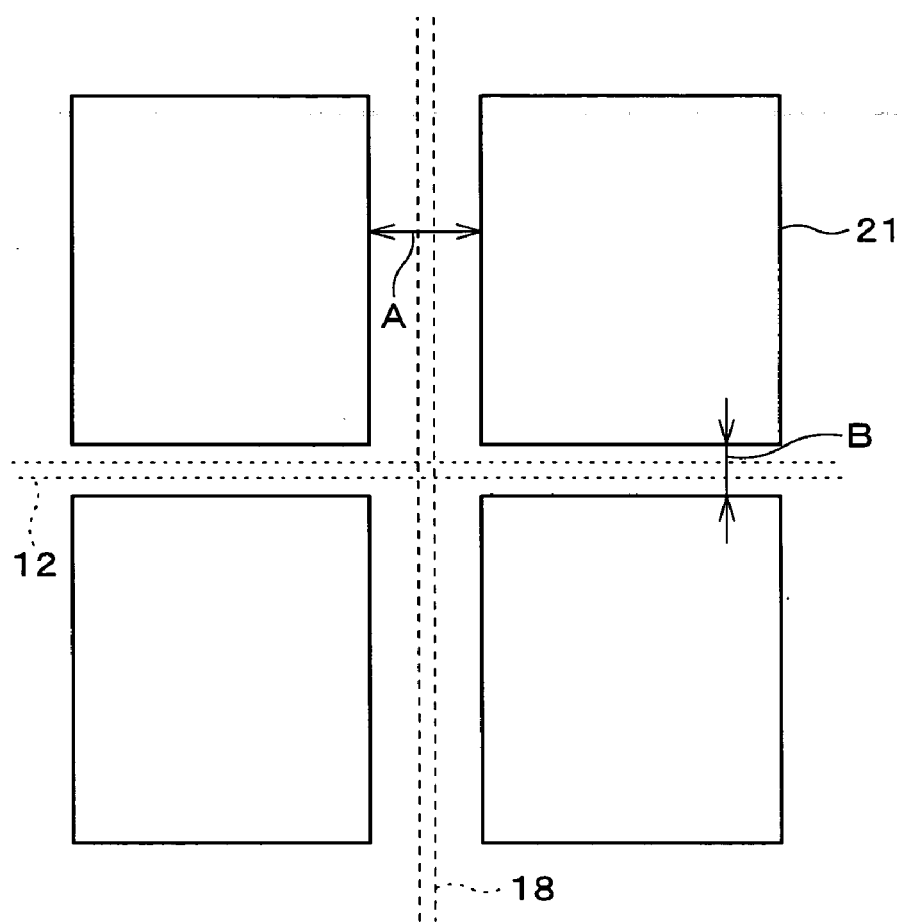
FIG. 4 is a plan view illustrating gaps between adjacent pixel electrodes in an active-matrix substrate used in the electromagnetic wave detector.

The advantages of the layout shown in FIG. 3 are described below. As illustrated in FIG. 4, in the pixel layout shown in FIG. 1(b) satisfying X1>Y1, a gap A between adjacent pixel electrodes 21 across the signal lines 18 (transverse direction in FIG. 4) is wider than a gap B between adjacent pixel electrodes 21 across the scanning lines (vertical direction in FIG. 4).

In the electromagnetic wave detector, the pixel electrodes 21 serve as the electrodes for collecting the generated charge in the semiconductor film 2 covering the pixel electrodes 21. It is generally known that the charge is easily trapped in the gap A and gap B between the pixel electrodes 21. The mechanism of this phenomenon is addressed in, for example, W. Zhao, G. DeCrescenzo, J. A. Rowlands, "Investigation of lag and ghosting in amorphous selenium flat-panel x-ray detectors," Proceedings of SPIE, Vol. 4682, pp. 9–20, 2002.

Excessive trapping of charge between adjacent pixel electrodes 21 is detrimental to image capturing, causing lag and ghosting. The adverse effects of trapped charge become more prominent as the gap between the pixel electrodes widens. Thus, by comparing the gap A and gap B, the adverse effects of trapped charge are more serious in gap A.

The problem of trapped charge can be overcome by exposing an area of trapped charge to light, as taught by Japanese Publication for Unexamined Patent Application No. 9153/1997 (Tokukaihei 9-9153) (corresponding U.S. Pat. No. 5,563,421).

Figure 5:
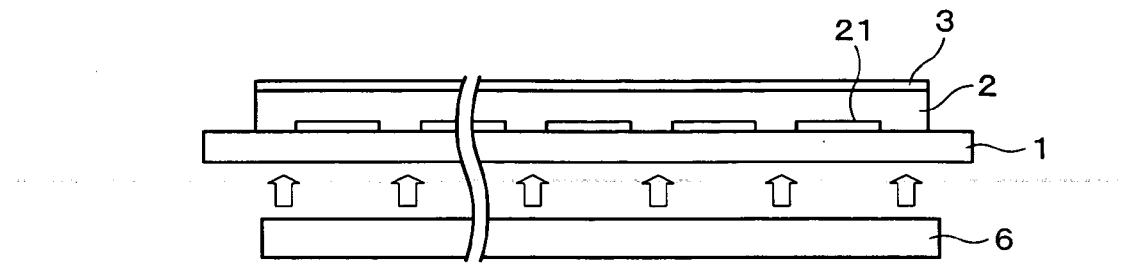
FIG. 5 is a cross sectional view illustrating a structure in which a light source is provided on a rear surface of the active-matrix substrate in the electromagnetic wave detector.

FIG. 5 illustrates an example of such a structure. As shown in FIG. 5, a flat light source 6 is provided on a rear surface of an active-matrix substrate 1 (on the back of the active-matrix substrate 1 bearing pixel electrodes 21). Note that, the other elements of the active-matrix substrate 1 are omitted in FIG. 5. By causing the flat light source 6 to project light over the gap A and gap B between the pixel electrodes 21 through the active-matrix substrate 1, the adverse effects of trapped charge can be prevented. The light of the flat light source 6 comes out of the active-matrix substrate 1 through openings defined by metal wires and metal electrodes formed on the active-matrix substrate 1, including scanning lines 12, signal lines 18, and capacitor electrodes 13a.

As noted above, the adverse effects of trapped charge are more serious in the wider of the two gaps, namely, gap A. This calls for a pixel layout that is more selective to gap A than gap B in terms of irradiated light.

The present embodiment therefore adopts a layout, as shown in FIG. 3, that satisfies X2>Y2, where X2 is the gap between the capacitor electrodes 13a and the signal lines 18, and Y2 is the gap between the capacitor electrodes 13a and the scanning lines 12. Further, in the layout shown in FIG. 3, the junction electrodes 15 and the capacitor electrodes 13a have substantially the same shape.

Further, the scanning lines 12, the signal lines 18, and the capacitor electrodes 13a in the layout of FIG. 3 are all made from a metal film. Hence, X2 and Y2 each define the width of an opening through which the light passes. Thus, the width X2, which is wider than Y2, allows entry of more light, thereby more efficiently irradiating the gap A. As a result, an electromagnetic wave detector is realized with minimum deficiencies, including lag and ghosting.

The present invention described in this embodiment is based on the active-matrix substrate in which the capacitor lines are disposed parallel to the scanning lines. However, the present invention is not just limited to such a structure. For example, the capacitor lines may be disposed parallel to the signal lines. Further, the element structures of the active-matrix substrate are not just limited to the ones described above. In addition, the described structures of the present invention may suitably be employed even in a structure in which the capacitor electrodes are made from a light transmissive film such as ITO, when there is absorption of light, though minute quantity, through the light transmissive film.

As described, an active-matrix substrate of the present invention includes: a substrate; a signal line; a scanning line; a switching element; and a pixel electrode, the signal line and the scanning line forming a lattice on the substrate, and the switching element and the pixel electrode being provided for each unit lattice of the signal line and the scanning line, the pixel electrode not overlapping the signal line and the scanning line, and satisfying a relation X1>Y1, where X1 is a gap between the pixel electrode and the signal line, and Y1 is a gap between the pixel electrode and the scanning line.

In order to improve the S/N ratio of the read-out signals, the electromagnetic wave detector using the active-matrix substrate requires the signal lines to have a smaller wire capacitance than the scanning lines. By satisfying X1>Y1, the parasitic capacitance generated between the pixel electrodes (charge collecting electrodes) and the signal and scanning lines in the active-matrix substrate can be reduced more for the signal lines than for the scanning lines.

With the structure in which the gap X1 between the pixel electrodes and the signal lines is wider than the gap Y1 between the pixel electrodes and the scanning lines, an electromagnetic wave detector is realized that provides a superior S/N ratio by reducing the wire capacitance of the signal lines, while maximizing the fill factor of the pixel electrodes (charge collecting electrodes).

The active-matrix substrate may be adapted to include: a capacitor, provided for each unit lattice, having a capacitor electrode made from a metal film, wherein the capacitor electrode does not overlap the signal line and the scanning line, and satisfies a relation X2>Y2, where X2 is a gap between the capacitor electrode and the signal line, and Y2 is a gap between the capacitor electrode and the scanning line.

In using the active-matrix substrate of this structure in an electromagnetic wave detector, light may be projected from the back of the active-matrix substrate to prevent the adverse effects of trapped charge between the pixel electrodes. The adverse effects of trapped charge between the pixel electrodes become more serious as the gap between the pixel electrodes increases.

The active-matrix substrate of the foregoing structure is advantageous in such applications because it enables more light to fall on the gap between the pixel electrodes bridging the signal lines wider than the scanning lines. Thus, with the active-matrix substrate, the adverse effects of trapped charge between the pixel electrodes can be minimized.

An electromagnetic wave detector of the present invention includes: an active-matrix substrate; a semiconductor film, disposed on the active-matrix substrate, for generating charge in response to an electromagnetic wave being detected; and a pixel electrode, disposed on the active-matrix substrate, serving as an electrode for collecting generated charge in the semiconductor film, the active-matrix substrate including: a substrate; a signal line; a scanning line; a switching element; and a pixel electrode, the signal line and the scanning line forming a lattice on the substrate, and the switching element and the pixel electrode being provided for each unit lattice of the signal line and the scanning line, and the pixel electrode not overlapping the signal line and the scanning line, and satisfying a relation X1>Y1, where X1 is a gap between the pixel electrode and the signal line, and Y1 is a gap between the pixel electrode and the scanning line.

As with the active-matrix substrate, with the structure in which the gap X1 between the pixel electrodes and the signal lines is wider than the gap Y1 between the pixel electrodes and the scanning lines, an electromagnetic wave detector is realized that provides a superior S/N ratio by reducing the wire capacitance of the signal lines, while maximizing the fill factor of the pixel electrodes (charge collecting electrodes).

The electromagnetic wave detector may be adapted so that a light source is provided on a back of the active-matrix substrate on which the pixel electrode is formed.

With this structure, light may be projected from the back of the active-matrix substrate when using the electromagnetic wave detector. In this way, the adverse effects of trapped charge between the pixel electrodes can be prevented.

The electromagnetic wave detector may be adapted so that: the active-matrix substrate includes a pixel capacitor that is provided for each unit lattice and having a capacitor electrode made from a metal film; and the capacitor electrode does not overlap the signal line and the scanning line, and satisfies a relation X2>Y2, where X2 is a gap between the capacitor electrode and the signal line, and Y2 is a gap between the capacitor electrode and the scanning line.

This structure enables more light to fall on the gap between the pixel electrodes bridging the signal lines wider than the scanning lines, making it possible to minimize the adverse effects of trapped charge between the pixel electrodes.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An active-matrix substrate comprising:
   a substrate;
   a signal line;
   a scanning line;
   a switching element; and
   a pixel electrode,
   the signal line and the scanning line forming a lattice on the substrate, and the switching element and the pixel electrode being provided for each unit lattice of the signal line and the scanning line,
   the pixel electrode not overlapping the signal line and the scanning line, and satisfying a relation X1>Y1, where X1 is a gap between the pixel electrode and the signal line, and Y1 is a gap between the pixel electrode and the scanning line, and wherein X1>Y1 is satisfied on both first and second opposing sides of the pixel electrode which are adjacent to first and second respective signal lines.

2. The active-matrix substrate as set forth in claim 1, further comprising:
   a capacitor, provided for each unit lattice, having a capacitor electrode made from a metal film,
   wherein the capacitor electrode does not overlap the signal line and the scanning line, and satisfies a relation X2>Y2, where X2 is a gap between the capacitor electrode and the signal line, and Y2 is a gap between the capacitor electrode and the scanning line.

3. An electromagnetic wave detector comprising:
   an active-matrix substrate;
   a semiconductor film, disposed on the active-matrix substrate, for generating charge in response to an electromagnetic wave being imaged; and
   a pixel electrode, disposed on the active-matrix substrate, serving as an electrode for collecting generated charge in the semiconductor film,
   the active-matrix substrate including:
   a substrate;
   a signal line;
   a scanning line;
   a switching element; and
   a pixel electrode,
   the signal line and the scanning line forming a lattice on the substrate, and the switching element and the pixel electrode being provided for each unit lattice of the signal line and the scanning line, and
   the pixel electrode not overlapping the signal line and the scanning line, and satisfying a relation X1>Y1, where X1 is a gap between the pixel electrode and the signal line, and Y1 is a gap between the pixel electrode and the scanning line.

4. The electromagnetic wave detector as set forth in claim 3, further comprising:
   a light source on a back of the active-matrix substrate on which the pixel electrode is formed.

5. The electromagnetic wave detector as set forth in claim 4, wherein:
   the active-matrix substrate includes a pixel capacitor that is provided for each unit lattice and having a capacitor electrode made from a metal film; and
   the capacitor electrode does not overlap the signal line and the scanning line, and satisfies a relation X2>Y2, where X2 is a gap between the capacitor electrode and the signal line, and Y2 is a gap between the capacitor electrode and the scanning line.

6. The active matrix substrate of claim 1, wherein the pixel electrode is a charge collecting electrode, and the active matrix substrate is part of an electromagnetic wave detector.

7. The active matrix substrate of claim 1, wherein the active matrix substrate is part of an electromagnetic wave detector that includes a semiconductor film for generating charge in response to an electromagnetic wave being imaged.

8. The electromagnetic wave detector of claim 3, wherein X1>Y1 is satisfied on both first and second opposing sides of the pixel electrode which are adjacent to first and second respective signal lines.

* * * * *